United States Patent
Ito et al.

(10) Patent No.: US 6,960,540 B2
(45) Date of Patent: Nov. 1, 2005

(54) FILM FORMATION METHOD, SEMICONDUCTOR ELEMENT AND METHOD THEREOF, AND METHOD OF MANUFACTURING A DISK-SHAPED STORAGE MEDIUM

(75) Inventors: Shinichi Ito, Yokohama (JP); Katsuya Okumura, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 181 days.

(21) Appl. No.: 09/842,403

(22) Filed: Apr. 26, 2001

(65) Prior Publication Data

US 2001/0039117 A1 Nov. 8, 2001

(30) Foreign Application Priority Data

Apr. 27, 2000 (JP) ........................................ 2000-127953
Oct. 11, 2000 (JP) ........................................ 2000-311124

(51) Int. Cl.⁷ ............................................. H01L 21/30
(52) U.S. Cl. ......................... 438/782; 427/96; 427/240
(58) Field of Search ...................... 438/782, FOR 391; 427/96, 240

(56) References Cited

U.S. PATENT DOCUMENTS

| | | | | | |
|---|---|---|---|---|---|
| 5,843,527 | A | * | 12/1998 | Sanada | 427/240 |
| 5,902,648 | A | | 5/1999 | Naka et al. | |
| 5,925,410 | A | * | 7/1999 | Akram et al. | 427/240 |
| 6,066,575 | A | * | 5/2000 | Reardon et al. | 438/782 |
| 6,162,745 | A | | 12/2000 | Ito et al. | 438/795 |
| 6,407,009 | B1 | * | 6/2002 | You et al. | 438/782 |
| 6,423,380 | B1 | * | 7/2002 | Courtenay | 427/421 |
| 6,461,983 | B1 | * | 10/2002 | Davlin et al. | 438/782 |
| 2001/0029111 | A1 | * | 10/2001 | You et al. | 438/782 |

FOREIGN PATENT DOCUMENTS

| | | | |
|---|---|---|---|
| GB | 1270984 A | 4/1972 | |
| GB | 2327629 A | 2/1999 | |
| JP | 62051221 A | * 3/1987 | ........... H01L/21/30 |
| JP | 02-220428 A | 9/1990 | |
| JP | 06-151295 A | 5/1994 | |
| JP | 07-321001 A | 12/1995 | |
| JP | 9-320950 | * 12/1997 | |
| JP | 2000-077326 A | 3/2000 | |
| JP | 2000-150352 | * 5/2000 | |
| WO | WO 98-57757 A | 12/1998 | |

OTHER PUBLICATIONS

Copy of U.S. patent application Ser. No. 09/735,553, filed Dec. 14, 2000 to Ema et al.
Ito et al.; "Liquid Film Forming Method", U.S. patent application Ser. No. 09/669,725, filed Sep. 26, 2000.*
Ito et al., "Apparatus and Method of Forming Liquid Film". U. S. patent application Ser. No. 09/335,508, filed Dec. 20, 2000.*
Ikegami, et al., "Deposition Apparatus", U.S. patent application Ser. No. 09/817,196, filed Mar. 27, 2001.*

* cited by examiner

*Primary Examiner*—Geroge Fourson
*Assistant Examiner*—Joannie Ade lle Garcia
(74) *Attorney, Agent, or Firm*—Finnegan, Henderson, Farabow, Garrett & Dunner, L.L.P.

(57) ABSTRACT

Relative movement occurs between the in-process substrate and the dropping section. While the substrate is rotated, the dropping section is relatively moved from an approximate center of the substrate toward an outer periphery thereof. While the dropping section relatively moves from the approximate center of the in-process substrate toward the outer periphery, the rotational frequency w for the substrate is decreased so that the solution film should not move due to the centrifugal force applied to a dropped solution film. Concurrently, feed rate v for the liquid from the dropping section is increased to form a solution film on the in-process substrate.

20 Claims, 11 Drawing Sheets

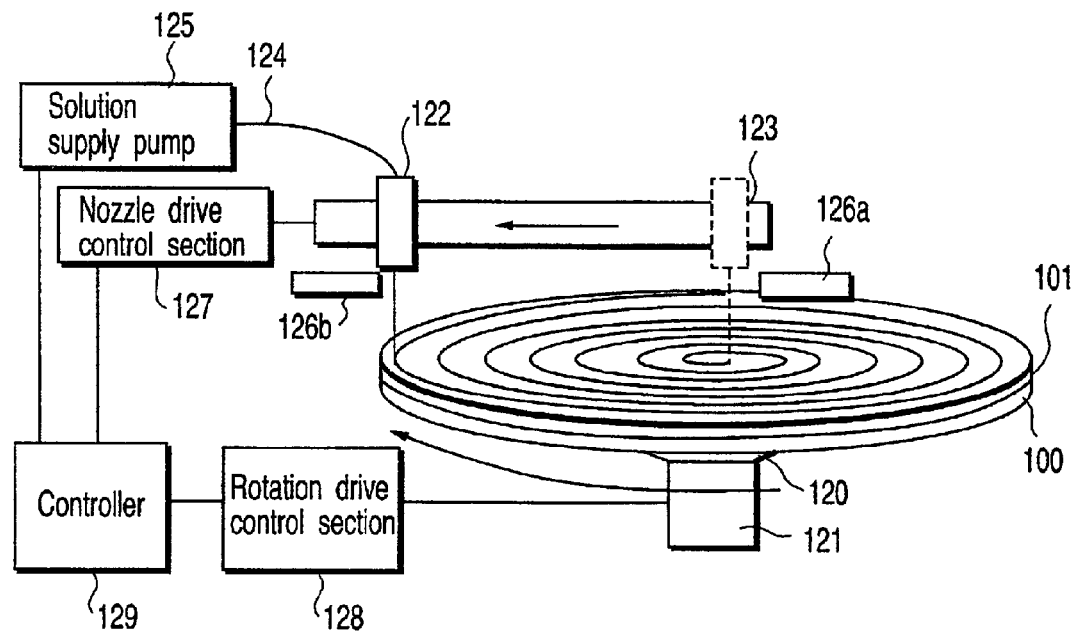
F I G. 1
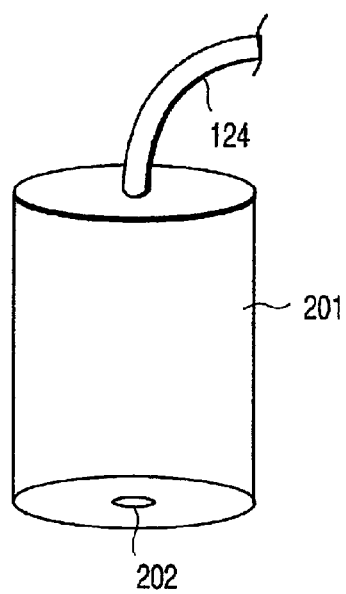
F I G. 2

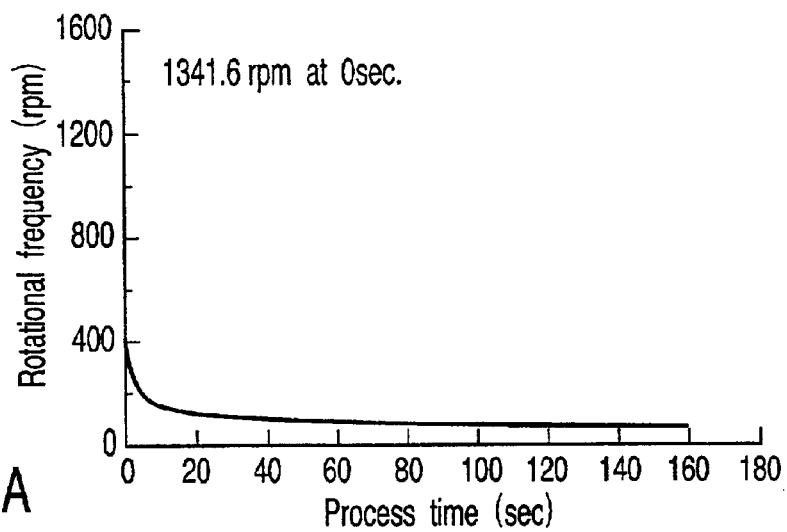
F I G. 3A
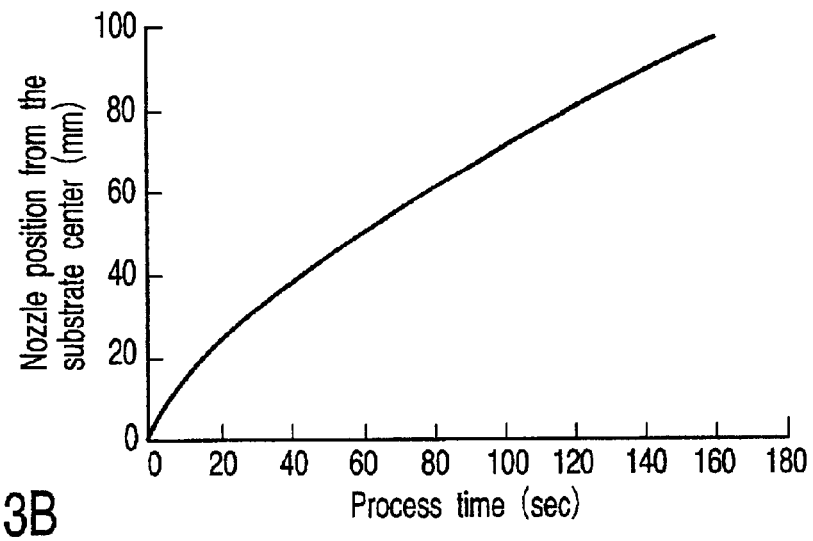
F I G. 3B
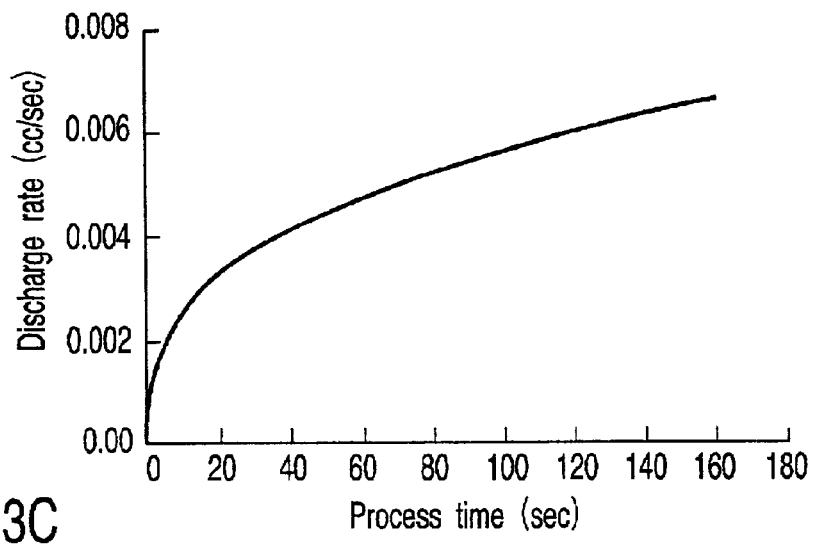
F I G. 3C r=100mm
Rotational frequency w0 (rpm)
Feed rate v0 (cc/min)

Radius r
Rotational frequency w (rpm)
Droplet amount v (cc/min)

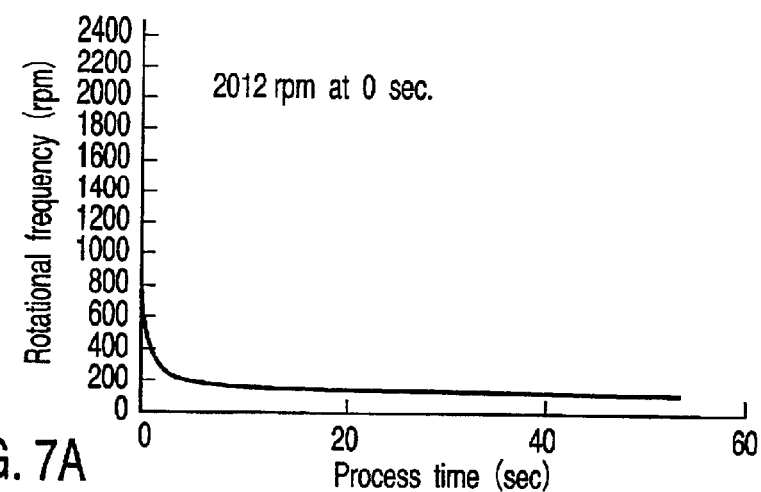
F I G. 7A
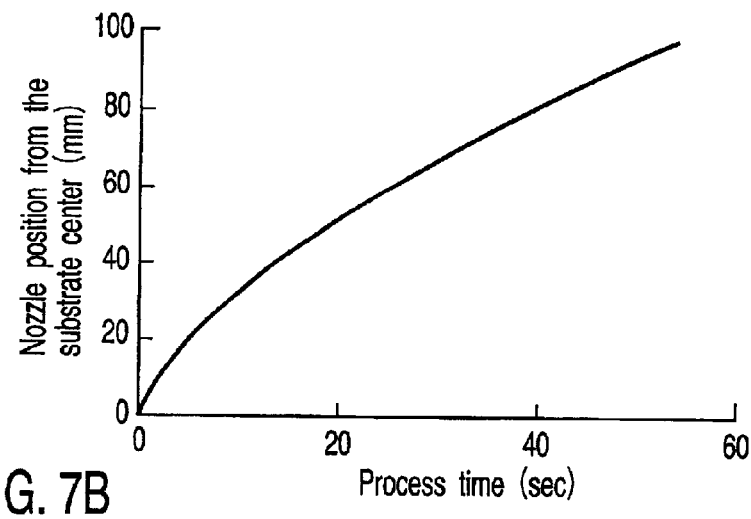
F I G. 7B
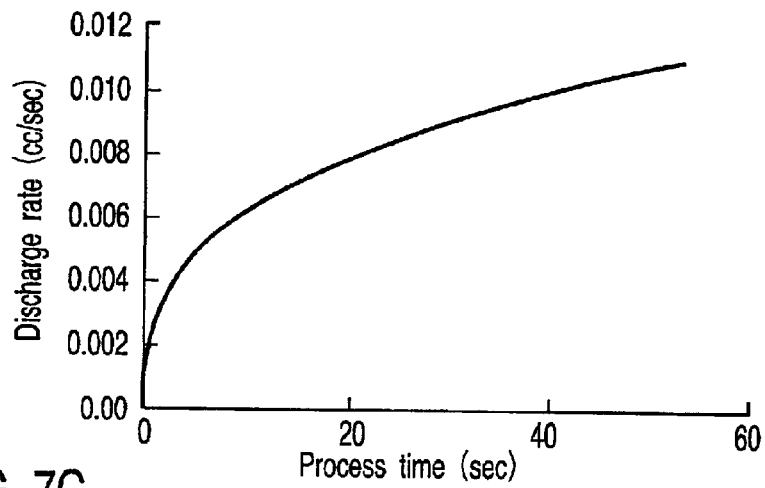
F I G. 7C

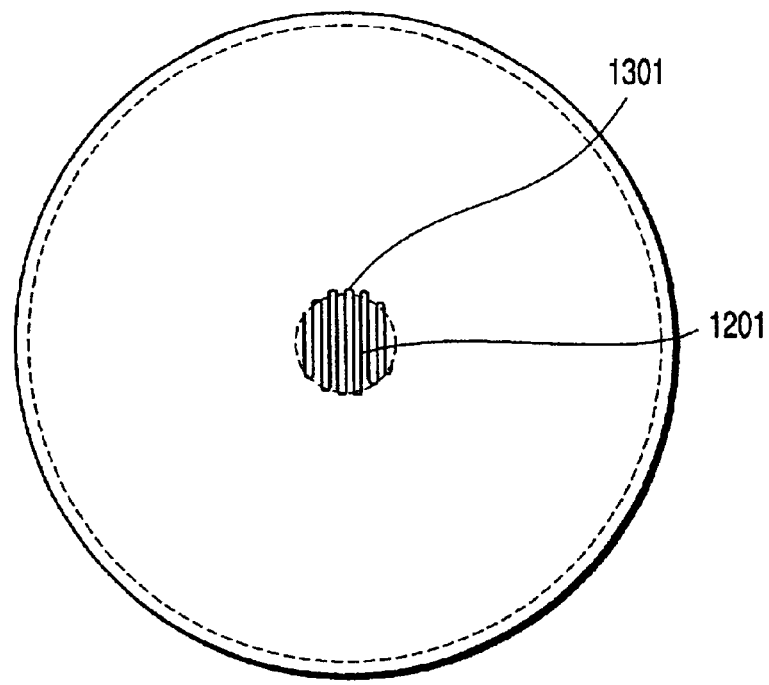
F I G. 13
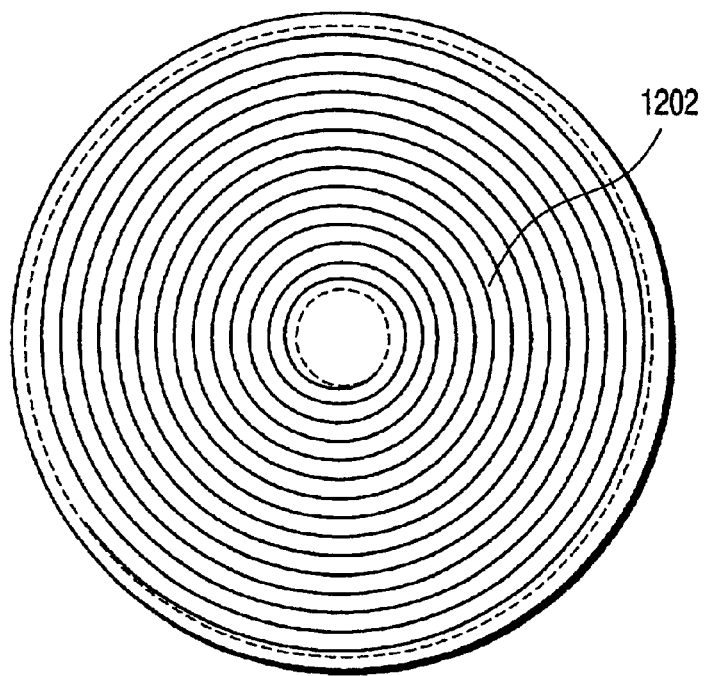
F I G. 14

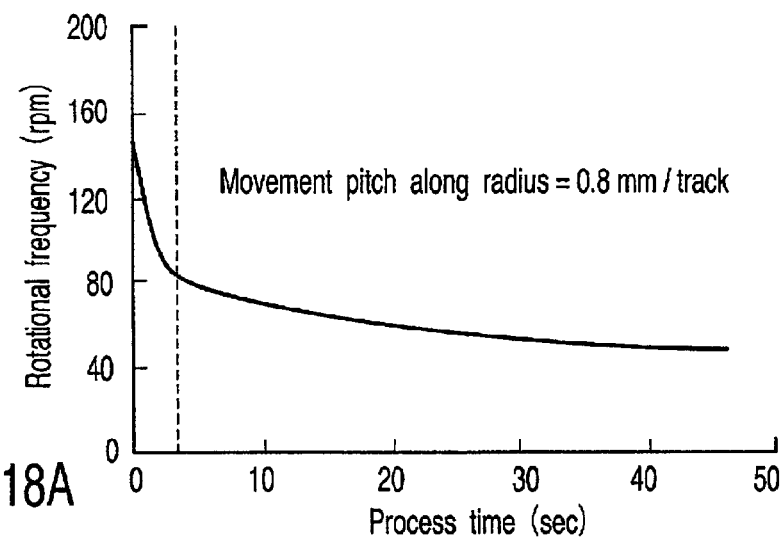
F I G. 18A
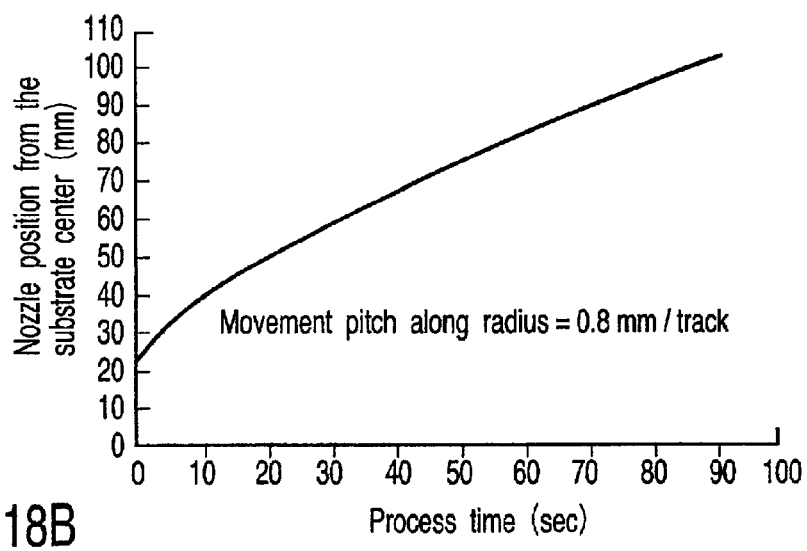
F I G. 18B
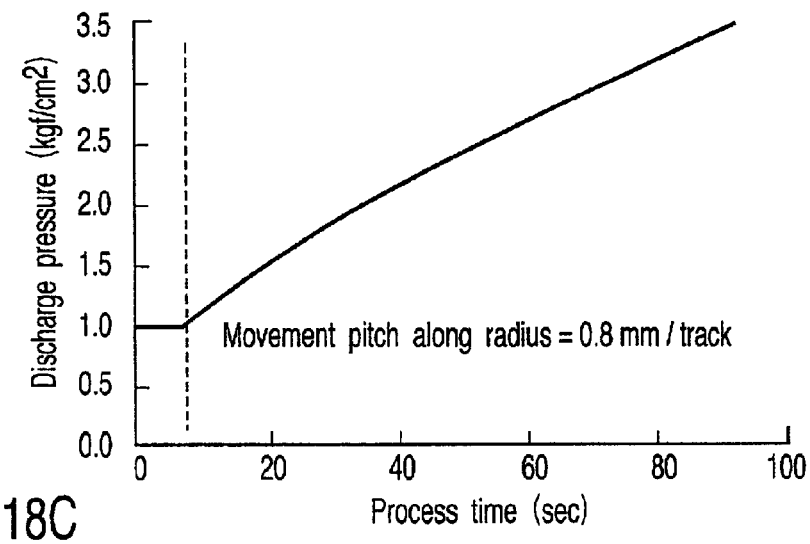
F I G. 18C

FILM FORMATION METHOD, SEMICONDUCTOR ELEMENT AND METHOD THEREOF, AND METHOD OF MANUFACTURING A DISK-SHAPED STORAGE MEDIUM

CROSS-REFERENCE TO RELATED APPLICATIONS

This application is based upon and claims the benefit of priority from the prior Japanese Patent Applications No. 2000-127953, filed Apr. 27, 2000; and No. 2000-311124, filed Oct. 11, 2000, the entire contents of both of which are incorporated herein by reference.

BACKGROUND OF THE INVENTION

The present invention relates to a method of forming a film by spirally dropping liquid on an in-process substrate.

The spin coating method has been conventionally used for a lithography process. This method discards most of liquid dropped on a substrate outside it and only uses a few percent of the remaining liquid for film formation. Much solution to be used is wasted and discarded, causing environmentally unfavorable effects. When the method is applied to a square substrate or a large circular substrate 12 inches or more in diameter, turbulence occurs at an outer periphery of the substrate, causing the film thickness to be partially uneven.

There are disclosed several methods of evenly applying solution on the entire surface of a substrate. Jpn. Pat. Appln. KOKAI Publication No. 2-220428 describes the technique of providing a uniform film by dropping resist from many nozzles arranged in a row and spraying a gas or liquid onto a film formation face from the rear. In Jpn. Pat. Appln. KOKAI Publication No. 6-151295, a rod has many spray nozzles from which resist is dropped on a substrate to provide a uniform film. Jpn. Pat. Appln. KOKAI Publication No. 7-321001 describes the technique of using a spray head having many spray holes for coating by moving the spray head relative to a substrate. All of these coating apparatuses aim at providing a uniform film by arranging a plurality of dropping or spray nozzles in a row and scanning them along a substrate surface.

In addition to the above-mentioned coating method using an apparatus having a plurality of nozzles, there is provided a technique of forming a solution film by using a single liquid discharge nozzle and scanning it above an in-process substrate. This technique causes the problem that a single substrate requires a long process time or a large amount of solution to be used depending on how a nozzle is operated.

For solving these problems, Jpn. Pat. Appln. KOKAI Publication No. 2000-77326 discloses the coating technique by spirally supplying solution. This publication contains the description that, as coating conditions, it is desirable to perform coating by rotating a wafer at a low speed (say, 20 to 30 rpm) and moving a nozzle unit along a diameter direction (say, an X-direction) of this wafer. Another description is that it is important to keep a relative speed between a wafer and a nozzle unit constant. Namely, it is described that a nozzle's linear speed should be constant.

When the nozzle unit is moved at a constant speed, it is required to increase a rotational frequency inside an outer periphery of the nozzle for keeping the linear speed constant. When a 200 mm wafer is used, for example, a rotational frequency is assumed to be 30 rpm for a 100 mm radius. The rotational frequency is proportional to the reciprocal of the radius. The wafer needs to be rotated at 3,000 rpm for a radius of 1 mm or less. When the wafer is rotated at 3,000 rpm, the solution is instantaneously ejected outside the substrate even if the liquid coating starts from the center.

When the wafer is rotated at a constant low rotational frequency, a nozzle movement speed is very high at the center of the substrate. Even if a vibration is applied after coating to move the liquid, it is moved incompletely causing an uncoated region at the center, making it impossible to form a uniform film. There is the problem that discharging the solution at a constant linear speed disables formation of a solution film.

BRIEF SUMMARY OF THE INVENTION

With respect to film formation technology involving spirally supplying solution on an in-process substrate, it is an object of the present invention to provide a method of controlling a discharge of solution outside the in-process substrate and uniformly forming a film.

For achieving the above-mentioned object, the present invention is organized as follows.

(1) A film formation method according to the present invention is a method of forming a solution film on an in-process substrate by using a dropping section for dropping liquid and an in-process substrate just under the dropping section, maintaining the liquid dropped from the dropping section on the in-process substrate, and relatively moving the in-process substrate or the dropping section, wherein: relative movement between the in-process substrate and the dropping section means rotating the substrate and relatively moving the dropping section from an inner periphery of the substrate toward an outer periphery of the substrate; relative movement between the in-process substrate and the dropping section means rotating the substrate and relatively moving the dropping section from an inner periphery of the substrate toward an outer periphery of the substrate for spirally dropping the liquid on the in-process substrate; rotational frequency w for the substrate is decreased so that a centrifugal force applied to a dropped solution film should not move the dropped solution film in accordance with relative movement of the dropping section from the inner periphery of the in-process substrate toward the outer periphery and feed rate v for the liquid from the dropping section is increased to form a solution film on the in-process substrate; otherwise, relative movement between the in-process substrate and the dropping section means rotating the substrate and relatively moving the dropping section from the outer periphery of the substrate toward the inner periphery of the substrate; relative movement between the in-process substrate and the dropping section means rotating the substrate and relatively moving the dropping section from an outer periphery of the substrate toward an inner periphery of the substrate for spirally dropping the liquid on the in-process substrate; and rotational frequency w for the substrate is increased so that a centrifugal force applied to a dropped solution film should not move the dropped solution film in accordance with the relative movement of the dropping section from the outer periphery of the in-process substrate toward the inner periphery and feed rate v for the liquid from the dropping section is decreased to form a solution film on the in-process substrate.

Although a centrifugal force applied to a dropped solution film should not move the dropped solution film as mentioned above, this does not apply to the case where the solution spreads due to fluidity by the gravity.

Several preferred embodiments of the present invention are described below.

(a) When the dropping section is positioned at distance r from a center of the in-process substrate, feed rate v for the liquid from the dropping section is determined in accordance with rotational frequency w for the in-process substrate so that a constant value is maintained for the product of rotational frequency w by feed rate v of the substrate support.

(b) Rotational frequency w0 is assumed for an in-process substrate when the dropping section is positioned to radius R on the in-process substrate and feed rate v0 is assumed for the liquid when the dropping section is positioned to distance r from a center of the in-process substrate center; and when the substrate is positioned at the distance r, rotational frequency w for the substrate is determined by the product of the square root of (R/r) by w0 and feed rate v is determined by v0 divided by the square root of (R/r).

(c) When the in-process substrate is a disk-shaped substrate with radius R (mm), the dropping section drops liquid at the outmost periphery of the substrate and a rotational frequency (rpm) for the substrate is smaller than a square root of 1,000,000/R.

(d) When the in-process substrate is a disk-shaped substrate 200 mm in diameter, the dropping section drops liquid at the outmost periphery of the substrate and a rotational frequency for the substrate is 99 rpm or less.

(e) When the in-process substrate is a disk-shaped substrate 300 mm in diameter, the dropping section drops liquid at the outmost periphery of the substrate and a rotational frequency for the substrate is 81 rpm or less.

(f) Relative movement of the dropping section from an inner periphery to an outer periphery or from an outer periphery to an inner periphery of the in-process substrate is controlled to move for a specified pitch per revolution of the substrate.

(g) The dropping section includes a plurality of discharge openings for discharging liquid; and a discharge rate of the dropping section and a rotational frequency of the in-process substrate are determined by an average of displacements for a plurality of discharge openings.

(h) The liquid is one selected from the group consisting of a solution containing anti-reflection used for an exposure process, a solution containing a photosensitive material, a solution containing a low-dielectric material, a solution containing a ferroelectric material, a solution containing a electrode material, a solution containing a pattern transfer material, a solution containing a magnetic material used for a disk-shaped storage medium, and a solution containing a light absorptive/reactive material used for a disk-shaped storage medium.

(i) The in-process substrate with the solution film formed thereon is exposed under a pressure lower than a steam pressure at a process temperature for a solvent in the solution film, and the solvent is dried and removed to form a solid layer.

(j) The formed solution film is dried with vibration applied to form a solid layer having an almost flat surface.

(k) The in-process substrate with the solution film formed thereon is exposed to a current of air to dry and remove the solvent in the solution film for forming a solid layer.

(l) A method of manufacturing a disk-shaped storage medium forming the solid layer on the in-process substrate by using the film formation method, wherein the solid layer is a magnetic film or a light absorbent/reactive film. Disk-shaped storage media includes compact disks, MiniDiscs, digital video disks, hard disks, and the like.

(m) A region including an approximate center on the in-process substrate prevents a solution film from moving due to the centrifugal force applied to a dropped solution film by partially blocking liquid discharged from the dropping section so as not to reach the in-process substrate for droplet amount adjustment.

(n) Relative movement of the dropping section from the inner periphery of the in-process substrate toward the outer periphery corresponds to relative movement of the in-process substrate from an approximate center toward the outer periphery. Relative movement of the dropping section from the outer periphery of the in-process substrate toward the inner periphery corresponds to relative movement of the in-process substrate from the outer periphery toward an approximate center.

(o) A region including an approximate center of the in-process substrate is used in such a manner that the dropping section moves in a column direction from one end to the other in the region including an approximate center and moves in a row direction outside the region including an approximate center based on relative movement between the in-process substrate and the dropping section, and the dropping section supplies the in-process substrate with the solution at a feed rate v' to form a solution film. The feed rate v' is set so that it almost equals feed rate v for liquid spirally dropped just outside the region including an approximate center.

(p) A region including an approximate center on the in-process substrate prevents a solution film from moving due to a centrifugal force applied to a dropped solution film by partially blocking liquid discharged from the dropping section so as not to reach the in-process substrate for droplet amount adjustment.

According to the above-mentioned organization, the present invention provides the following effects.

According to the present invention, the feed rate v is increased for the liquid supplied from the dropping section. The rotational frequency w for the in-process substrate is decreased so that the solution film does not move due to a centrifugal force applied to the dropped solution film. The solution film does not move at the inner and outer peripheries. The in-process substrate is free from a region where no solution film is formed around the center. It is possible to form a uniform solution film.

A centrifugal force is proportional to the product of mass, distance from the rotation center, and the square of the rotational frequency. A vicinity of the rotation center causes a smaller centrifugal force applied to the solution film than that applied to an outer periphery. Accordingly, the rotational frequency is decreased at an inner periphery so that an increased rotational frequency should not cause a centrifugal force to move the solution film. This does not move the solution film and does not generate a region where no solution film is formed.

The rotational frequency is decreased and the liquid feed rate is increased to provide the constant liquid feed quantity on the in-process substrate, forming a uniform solution film.

The film formation according to the condition described in (a) can equalize the solution feed quantity per unit area. The condition described in (b) can determine an in-process substrate's rotational frequency and a liquid's dropping rate. The solution film does not move due to a centrifugal force according to the conditions described in (c) to (e). Moving the dropping section based on the condition described in (f) can form a uniform film void of a region where no solution film is formed. According to the condition described in (g), there is provided a solution supply nozzle having two discharge openings each of which provides the same feed rate. When this nozzle is used, it is possible to form a uniform solution film even if the same feed rate is applied to a positioned discharge opening. The embodiment (h) shows an applicable scope of the liquid. According to the embodiments (i) and (k), it is possible to form a solid layer with a uniform thickness from the solution film. The embodiment (j) enables to form a solid layer with a uniform thickness.

When a solid layer is formed according to the present invention, uniformity of the film thickness is improved. Consequently, a semiconductor element containing this solid layer provides excellent electric characteristics.

When this method is used for coating a disk-shaped storage medium, it is possible to make the coating film thickness uniform and improve the storage reliability.

The solution is blocked for a substrate's center region where spiral coating is difficult, making it possible to equalize the solution feed quantity per unit area.

Linear coating is performed for a substrate's center region where the spiral coating is difficult, making it possible to equalize the solution feed quantity per unit area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a configuration chart showing a configuration of a film formation apparatus according to a first embodiment;

FIG. 2 is a configuration chart showing a configuration of a solution supply nozzle constituting the film formation apparatus in FIG. 1;

FIG. 3A is a characteristic chart showing a rotational frequency of an in-process substrate with reference to a process time according to the first embodiment;

FIG. 3B is a characteristic chart showing a nozzle position with reference to a process time according to the first embodiment;

FIG. 3C is a characteristic chart showing a solution discharge rate with reference to a process time according to the first embodiment;

FIG. 7A is a characteristic chart showing a rotational frequency of an in-process substrate with reference to a process time according to the second embodiment;

FIG. 7B is a characteristic chart showing a nozzle position with reference to a process time according to the second embodiment;

FIG. 7C is a characteristic chart showing a solution discharge rate with reference to a process time according to the second embodiment;

FIG. 13 shows a movement trail of the solution supply nozzle in the linear coating region according to the fourth embodiment;

FIG. 14 shows a movement trail of the solution supply nozzle in the spiral coating region according to the fourth embodiment;

FIG. 18A is a characteristic chart showing a rotational frequency of an in-process substrate with reference to a process time according to the fifth embodiment;

FIG. 18B is a characteristic chart showing a nozzle position with reference to a process time according to the fifth embodiment; and FIG. 18C is a characteristic chart showing a solution discharge pressure with reference to a process time according to the fifth embodiment.

DETAILED DESCRIPTION OF THE INVENTION

Figure 4:
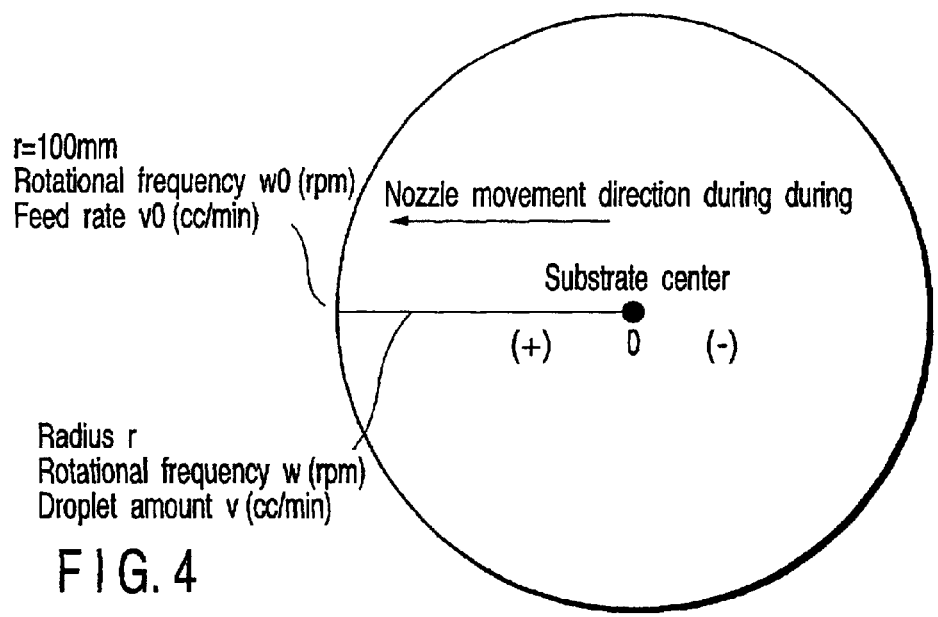
FIG. 4 is a plan view showing a nozzle movement direction for supplying a solution.

Embodiments of the present invention will be described in further detail with reference to the accompanying drawings.

[First Embodiment]

FIG. 1 is a configuration chart showing a configuration of a film formation apparatus used for the present invention.

As shown in FIG. 1, an in-process substrate 100 is mounted on a substrate support 120 which is connected to a drive system 121 revolving around a center of the substrate 100. Above the in-process substrate 100, a solution supply nozzle 122 is installed. By discharging solution, the solution supply nozzle 122 is moveable in a diameter direction according to a nozzle drive system 123. The solution supply nozzle 122 is connected to a solution supply pump 125 which supplies the solution supply nozzle 122 with solution via a solution supply pipe 124. Solution discharge from the solution supply nozzle 122 is controlled by controlling a solution supply pressure from a solution supply pump 125.

FIG. 2 shows a configuration example of the solution supply nozzle 122. As shown in this figure, the solution supply nozzle 122 includes a solution bath 201 and a solution discharge opening 202. The solution bath 201 temporarily reserves solution supplied from the solution supply pipe 124 connected to a solution supply pump 125. The solution discharge opening 202 discharges solution from the solution bath 201.

According to the nozzle drive system 123, the solution supply nozzle 122 begins moving almost from the center of the in-process substrate 100. The solution supply nozzle 122 moves to almost a substrate edge by successively supplying solution on the in-process substrate. A supply of the solution stops when the solution supply nozzle reaches the in-process substrate edge. Solution block functions 126a and 126b are provided at a movement start point and a movement stop point. The solution block function 126a at the movement start point blocks the solution discharged from the solution supply nozzle 122 to prevent the solution from reaching the in-process substrate 100. The solution is blocked until the rotational frequency of the substrate support 120, the movement speed of the nozzle drive system 123, and the speed of the solution discharged from the solution supply nozzle 122 reach specified values needed for starting the coating. The solution block function 126b at the movement stop point waits above the edge of the in-process substrate 100 for preventing the solution from being supplied to this edge. When the solution supply nozzle 122 moves to the edge of the substrate 100, the solution block function 126b blocks the solution discharged from the nozzle 122 to prevent the solution from reaching the in-process substrate 100.

While the solution is supplied to the in-process substrate 100, a rotation drive control section 128, a nozzle drive control section 127, and the solution supply pump 125 manage the substrate support 120's rotational frequency, the nozzle drive system 123's movement speed, and the solution discharge speed from the solution supply nozzle 122. A controller 129 manages these control sections 125, 127, and 128 and is located upstream thereof.

Based on positional information for the solution supply nozzle 122 on the substrate, the controller 129 determines the rotational frequency, the nozzle drive speed, and the solution discharge speed for the rotation drive control section 128. The controller then issues commands to the rotation drive control section 128, the nozzle drive control section 127, and the solution supply pump 125. Based on the commands, these components operate to supply the solution spirally on the in-process substrate. When supplied on the in-process substrate, the solution spreads by the gravity and combines with an adjacent solution film to form a unified solution film 101 on the in-process substrate.

After the solution film 101 is formed, the in-process substrate 100 is subject to a process of drying and removing solvent from the solution film. Drying techniques include heating, drying under reduced pressure, and contact with an air flow on the surface.

Described below is an example of applying this means for forming a solution film to a process of forming an ArF photosensitive resin film 400 nm thick on an Si wafer (in-process substrate) of φ200 mm (8-inch) in diameter. The photosensitive resin solution contains a 1.5% solid content. The Si wafer is provided with an antireflection film for canceling light reflected on the substrate during ArF exposure according to a technique similar to the following.

First, there has been measured a rotational frequency at which the photosensitive resin solution does not scatter outside the substrate on the outmost periphery (φ194 mm) thereof. From a stop state, the rotational frequency is increased gradually at a roll acceleration of 100 rpm/sec to find a rotational frequency at which the photosensitive resin solution scatters outside the substrate. The photosensitive resin solution scattered outside the substrate at 80 rpm. A rotational frequency w0=60 rpm is set for the substrate's outer periphery so as not to exceed the centrifugal force at this time. Under this condition, there have been found a rotational frequency, a nozzle drive speed, and a solution discharge speed for the rotation drive control section with reference to the process time.

In this embodiment, the spiral solution film formation position advances toward the substrate's outer periphery in pitches of 0.4 mm every cycle. A solution feed rate v0 is set to 0.4 cc/min at a distance r=100 mm from the substrate center.

An area change rate dS/dr=27 πr is set at the distance r from the substrate center. An area change rate at the distance r from the substrate center is proportional to the distance r from the substrate center. It is necessary to let a ratio of a substrate radius r0 (100 mm in this embodiment) to a solution feed quantity q0 equal a ratio of a distance r (mm) from the substrate center to a solution feed quantity q.

Accordingly, the solution feed quantity q at distance r from the substrate center must be:

$$q = q0 \, r/r0 \qquad (1)$$

The following relation is formed between the solution feed rate v (cc/min) at distance r from the substrate center and the solution feed quantity q.

$$q = v/w \qquad (2)$$

According to equations (1) and (2), the following condition must be satisfied for finding the solution feed rate v and the rotational frequency w at distance r from the substrate center.

$$v/w = (v0/w0) \times (r/r0) \qquad (3)$$

This embodiment assmes that the same rate of change be given to the solution feed rate v and the rotational frequency w. The following values are determined at the distance r from the substrate center.

$$v = v0/(r0/r)^{1/2} \qquad (4)$$

$$w = w0(r0/r)^{1/2} \qquad (5)$$

The following expresses a centrifugal force F applied to the solution film in a fine unit area with a radius r using a solution film degree c.

$$F = mrw^2$$

$$= c(q0 \, r/r0 \, / \, 2 \, \pi r) rw^2$$

$$= c(q0/2 \, \pi r0) rw^2$$

To make the centrifugal force F invariable, a constant C should be used as follows.

$$w = C/r^{1/2}$$

When this equation is compared to the equation (5), C can be assumed to be a constant. If an operation is performed so that the equations (4) and (5) are satisfied with respect to the radius r, the solution film coating is available by keeping a constant centrifugal force to a solution film at a given radius r.

FIGS. 3A to 3C depict nozzle positions (assuming the center to be 0), the rotation drive control section's rotational frequencies, nozzle drive speeds, and solution discharge speeds with reference to the thus determined process times. These relations are pre-stored in the controller in advance. It may be preferable to store these relations in downstream control sections individually. Then the photosensitive resin solution is applied to the in-process substrate. As shown in FIG. 4, the description to follow uses a plus axis (+) to express the same movement as the nozzle movement direction when the solution is supplied. The reverse movement is expressed as a minus axis (−).

First, the solution supply nozzle 122 is moved to a position −1 mm from the in-process substrate center. The solution block function 126a is adjusted so that it reaches a region of +0.2 mm or less. When the nozzle 122 is positioned +0.2 mm or less, the solution block function 126a operates so that the photosensitive resin solution dropped from the nozzle 122 does not reach the substrate surface.

Then, the drive system 121 drives the substrate support 120. The in-process substrate 100 starts rotating to keep the rotational frequency of 1,341.6 rpm. A droplet amount of the photosensitive resin solution is adjusted so that the solution should be ejected from the solution supply nozzle at 0.018 cc/min. After the rotational frequency and the feed rate are stabilized, the solution supply nozzle starts moving toward the plus side at 31 mm/sec. When the center of the nozzle discharge opening is positioned +0.2 mm or less, uniform velocities are maintained for the substrate rotation, the nozzle movement, and the solution feed. When the center of the nozzle discharge opening reaches +0.2 mm, the rotation drive control section, the nozzle drive control section, and the solution supply pump are controlled according to FIGS. 3A to 3C. As shown in FIGS. 3A to 3C, the substrate's rotational frequency w is decreased as the solution supply nozzle moves approximately from the center of the substrate toward the outer periphery. In addition, the feed rate v is increased for the photosensitive resin solution supplied from the solution supply nozzle. The rotational frequency in FIG. 3A does not cause the photosensitive resin solution to be moved due to a centrifugal force. Accordingly, the photosensitive resin solution does not scatter outside the substrate. Although the centrifugal force should not move the photosensitive resin solution as mentioned above, this does not apply to the case where the photosensitive resin solution spreads due to fluidity.

When the solution supply nozzle reaches above the solution block function at the substrate edge, the solution supply means stops supplying the solution, the solution supply nozzle stops, and the in-process substrate stops rotating to complete the solution film formation. It took about 150 seconds to process a single 200-mm wafer. The solution film spirally formed during the process spreads and is combined to the adjacent solution film to form a solution film which covers the entire substrate except the edge. During the process, no photosensitive resin solution was ejected outward from the substrate.

The substrate is then placed in the chamber and is exposed under almost the same pressure as a steam pressure for the solvent in the photosensitive resin solution. The solvent is gradually removed to form a photosensitive resin film.

According to the present invention, the feed rate v is increased for the solution supplied from the dropping section. The rotational frequency w for the in-process substrate is decreased so that the solution film does not move due to a centrifugal force applied to the dropped solution film. The solution film does not move near the center and at the outer periphery. The in-process substrate is free from a region where no solution film is formed around the center. It is possible to form a uniform solution film.

The present invention keeps the solution on the substrate except when a small amount of solution is discarded just before and after the coating. It is possible to achieve a disposal amount within 1%.

This embodiment has explained a process of forming a photosensitive resin film from the photosensitive resin solution and then the photosensitive resin solution film in order. The present invention is not limited to this usage. The present invention is also applicable to formation of a dielectric constant film from a solution containing a low-dielectric constant film material such as an organic siloxane solution, formation of a ferroelectric film from a solution containing a ferroelectric film material, formation of an electrode from solution containing an electrode material, and formation of a pattern transfer film.

The rotational frequency w0 is not limited to 60 rpm at the outmost periphery of the substrate. Any value is specifiable as long as a small amount of solution does not overflow outside the substrate. In this embodiment, it may be preferable to use a value of 80 rpm or less. It may be also preferable to modify an interval of spiral solution film formation positions for each cycle and the solution feed rate v0 with r=100 mm 100 mm depending on a desired film thickness and uniformity.

In FIG. 1, there are provided two solution block functions for the start and stop sections. It may be preferable to use one solution block function for both purposes. In this case, the solution block function first blocks the solution around the substrate center before starting the movement. The solution block function then moves to the substrate edge prior to the nozzle and waits for operation there.

[Second Embodiment]

This embodiment explains a technique for improving a film formation speed.

Figure 5:
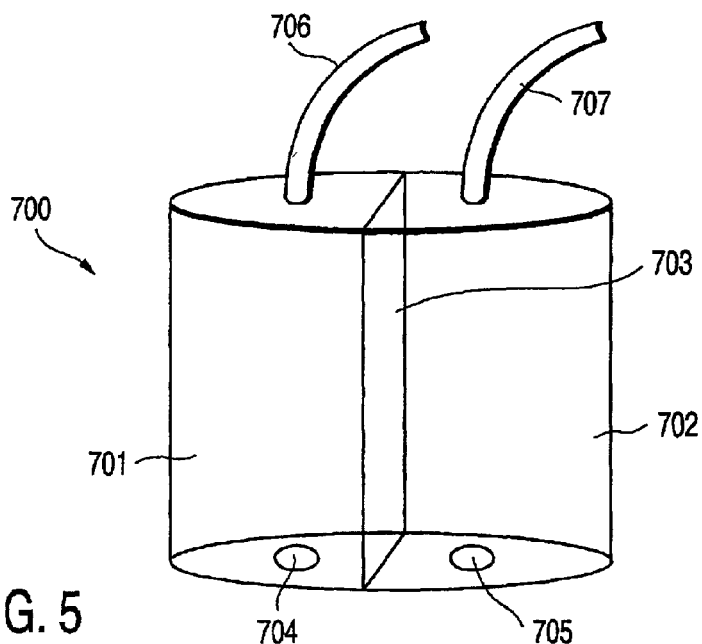
FIG. 5 is a configuration chart showing a configuration of a solution supply nozzle according to a second embodiment.

For improving the film formation speed, this embodiment, as shown in FIG. 5, uses a nozzle having first and second solution baths 701 and 702 provided with first and second solution discharge openings 704 and 705. These solution baths are separated by a partition plate 703. The first and second solution discharge openings 704 and 705 are arranged along the diameter direction. The first and second solution baths 701 and 702 are supplied with solution from first and second solution supply pipes 706 and 707. The first and second solution supply pipes 706 and 707 are connected to independent solution supply pumps. It is possible to individually control solution discharge speeds from the two solution discharge openings 704 and 705 by independently controlling pressures of the respective solution supply pumps. Since the configuration of the entire apparatus is the same as that in FIG. 1, illustrations and an explanation of the configuration are omitted.

In this embodiment, the present invention is applied to film formation of a solution containing a low-dielectric material. The low-dielectric material used contains polysiloxane. We aimed at forming an inter-layer insulator with a thickness of 1,000 nm. The solution contains a 5% solid content.

Figure 6:
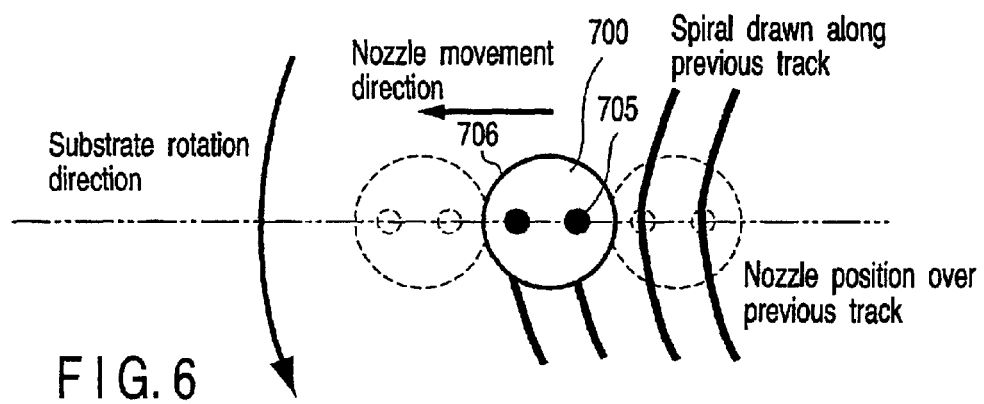
FIG. 6 is a plan view showing how the solution supply nozzle in FIG. 5 moves.

The solution used here contains a low-dielectric material. A technique similar to that for the first embodiment is used to find a rotational frequency at which the solution does not scatter outside the substrate at its outmost periphery (φ194 mm). The result is 99 rpm. A rotational frequency w0=90 rpm is set for the substrate's outer periphery so as not to exceed the centrifugal force at this time. Under this condition, there have been found a rotational frequency, a nozzle drive speed, and a solution discharge speed for the rotation drive control section with reference to the process time for each position. In this embodiment, as shown in FIG. 6, the spiral solution film formation position advances toward the substrate's outer periphery in pitches of 0.8 mm every cycle.

Experimental results show that a rotational frequency of 82 rpm does not scatter the solution containing the low-dielectric material outside the substrate at the outmost periphery of a 300-mm wafer. the centrifugal force applied to a material is proportional to a distance from the rotation center and the square of a rotational frequency. It is assumed that a distance from the rotation center is 100 mm and the rotational frequency is 100 rpm. For equalizing the centrifugal force at a distance r (mm) from the rotation center on the solution film, it is necessary to set the rotational frequency to $(1,000,000/R)^{1/2}$. Accordingly, it is assumed that the dropping section supplies droplets of solution at the outmost periphery of a disk-shaped substrate having a radius of R (mm). When the substrate's rotational frequency is set to a value smaller than the square root of 1,000,000/R, the centrifugal force does not move the solution film while the solution is supplied.

Figure 8:
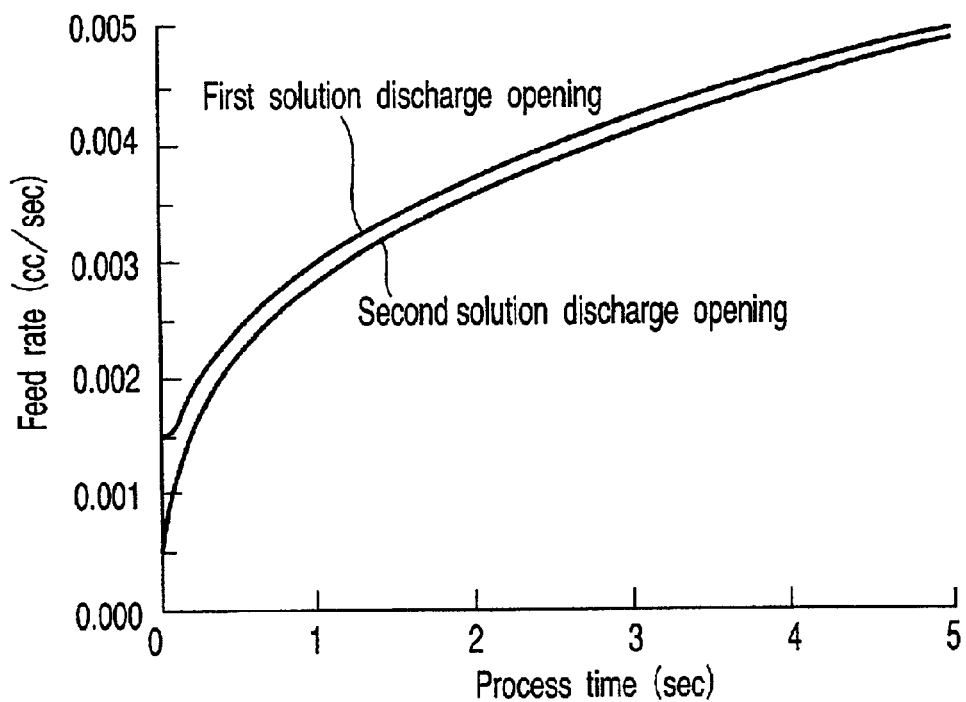
FIG. 8 is a characteristic chart showing a solution discharge rate with reference to a process time.

FIGS. 7A to 7C depict nozzle positions (assuming the center to be 0), the rotation drive control section's rotational frequencies, nozzle drive speeds, and solution discharge speeds with reference to the process times. FIG. 7A assumes the center of the two solution discharge openings to be the nozzle position. The scale in FIG. 7C provides no difference between feed rates from the two solution discharge openings. Then, FIG. 8 shows feed rates from the two solution discharge openings for process times between 0 and 5 seconds.

These relations are stored in the controller in advance. It may be preferable to store these relations in downstream control sections individually. Then the solution containing the low-dielectric material is applied to the in-process substrate. The description to follow uses a plus axis (+) to express the same movement as the solution supply nozzle movement direction when the solution is supplied. The reverse movement is expressed as a minus axis (−).

First, the nozzle is moved to a position −1 mm from the in-process substrate center. The solution block function is adjusted so that it is positioned just under the nozzle. The solution block function blocks the solution discharged from the nozzle.

The in-process substrate starts rotating to keep the rotational frequency of 2,012 rpm. Further, the nozzle is adjusted to a droplet rate of 0.030 cc/min. After the rotational frequency and the feed rate are stabilized, the solution supply nozzle and the solution block function start moving toward the plus side at 243 mm/sec. Uniform velocities are maintained until the center of the nozzle discharge opening reaches the +0.2 mm point. When this center passes the +0.2 mm point, control has started to decelerate the rotation drive control section, decelerate the nozzle drive control section, and accelerate the solution supply pump according to the relations in FIGS. 7A to 7C and FIG. 8. Since the solution block function continues to move at a uniform velocity, the solution block function moves just under the solution supply nozzle. Then, the solution supply nozzle starts supplying the solution to the in-process substrate. The solution block function stops at the substrate edge and waits until the solution supply nozzle reaches it. When the solution supply nozzle is positioned just above the solution block function waiting at the substrate edge, the solution supply means stops supplying the solution, the solution supply nozzle stops, and the in-process substrate stops rotating to complete the solution film formation. It took about 53 seconds to process a single 200-mm wafer. While the solution was supplied, no solution was ejected outward from the substrate. The solution film spirally formed during the process spreads and is combined to the adjacent solution film to form a solution film which covers the entire substrate except the edge.

The substrate is then placed in the chamber and is exposed under almost the same pressure as a steam pressure for the solvent in the solution. The solvent is gradually removed to form an inter-layer insulator.

The conventional solution film formation moves the nozzle reciprocally and linearly by bridging the substrate, requiring an entrance region for every turn. This method ejects the solution outside the substrate at a disposal rate of 10% to 20% for the amount of solution supplied to the in-process substrate. The disposal rate is found by "the amount of solution ejected outside the substrate" divided by "the feed quantity within the substrate". However, the present invention discards a small amount of solution just before and after the coating. It is possible to achieve a disposal amount within 1%.

This embodiment has explained a process of forming an inter-layer insulator from the solution containing the low-dielectric material and then the low-dielectric solution film in order. The present invention is not limited to this usage. The present invention is also applicable to formation of a resist film, an antireflection film, and a ferroelectric film from the solution containing ferroelectric film material.

The rotational frequency w0 is not limited to 90 rpm at the outmost periphery of the substrate. Any value is specifiable as long as a small amount of solution does not overflow outside the substrate. In this embodiment, it may be preferable to use a value of 95 rpm or less. It may be also preferable to modify an interval of spiral solution film formation positions for each cycle and the solution feed rate v0 with r=100 mm depending on a desired film thickness and uniformity.

Figure 9:
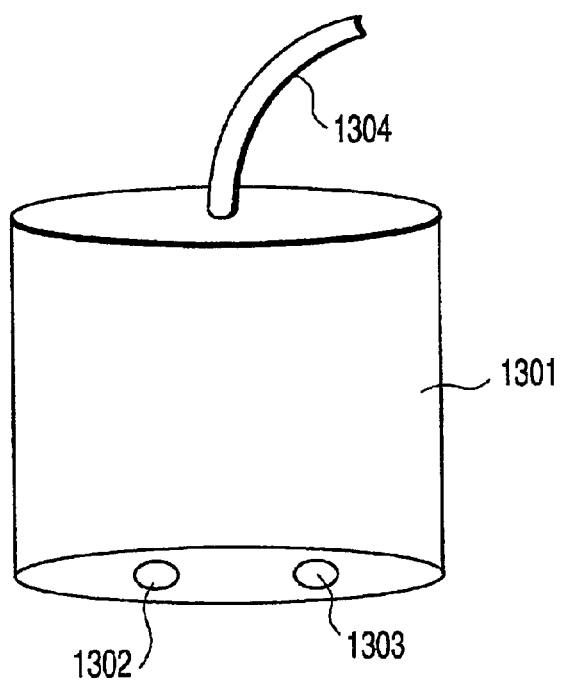
FIG. 9 is a configuration chart showing a modification of the solution supply nozzle.

This embodiment uses the solution supply nozzle which can control feed rates for two discharge openings independently, but is not limited thereto. It may be preferable to use a solution supply nozzle in FIG. 9 which provides the two discharge openings with the same feed rate simultaneously. In this case, the feed rate setting can be an average of solution feed rates from the first and second solution discharge openings according to the characteristic charts in FIGS. 7C and 8. It is possible to form a solution film at this rate and provide a uniform film thickness by applying a shock to the solution film during a dry process.

This embodiment uses the nozzle having two discharge openings, but is not limited thereto. It is possible to use a nozzle having three or more discharge openings.

The present invention is not limited to the above-mentioned embodiment. For example, the present invention is applicable to all film formation processes including not only a semiconductor process of anti-reflection coating and resist coating used for the lithography, and low-dielectric or ferroelectric material coating, but also a decorative process such as plating.

It is further understood by those skilled in the art that various changes and modifications may be made in the present invention without departing from the spirit and scope thereof.

[Third Embodiment]

This embodiment relates to a technique of forming a light absorptive/reactive film for a compact disk recording medium (CD-R) used as a computer storage. This embodiment uses the same film formation apparatus as described for the first embodiment with reference to FIG. 1.

An in-process substrate is 12 cm in diameter and ensures a region within φ40 mm (radius r=0 to 20 mm) from the center as a holding region where no film is formed. The technique according to the present invention is used to coat a region ranging from the radius r=20 to 60 mm on this substrate with a light absorptive/reactive film.

Figure 10A:
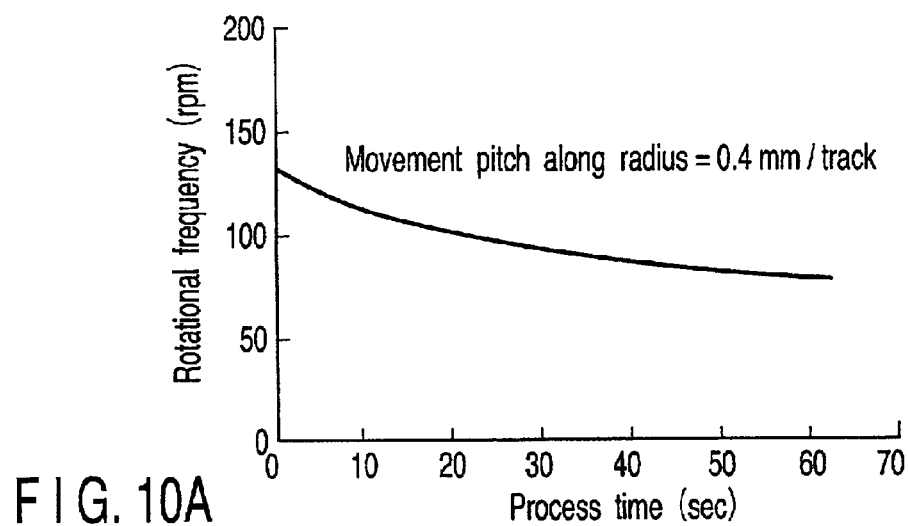
FIG. 10A is a characteristic chart showing a rotational frequency of an in-process substrate with reference to a process time according to a third embodiment.
Figure 10B:
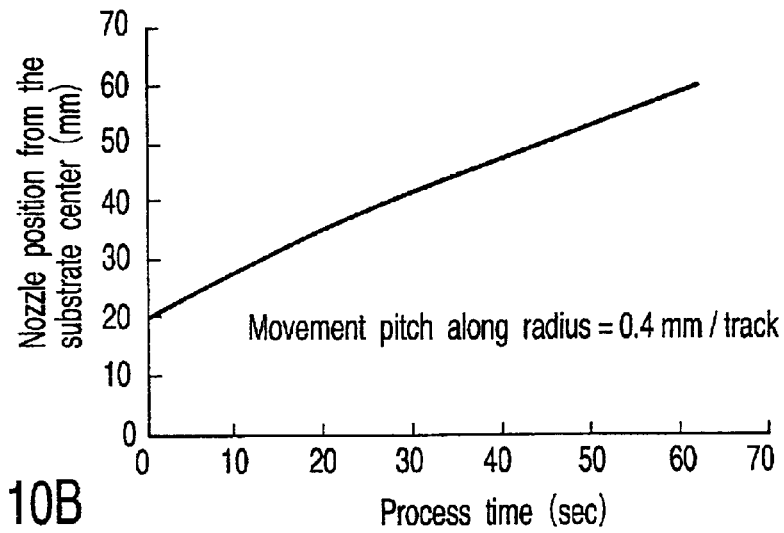
FIG. 10B is a characteristic chart showing a nozzle position with reference to a process time according to the third embodiment.
Figure 10C:
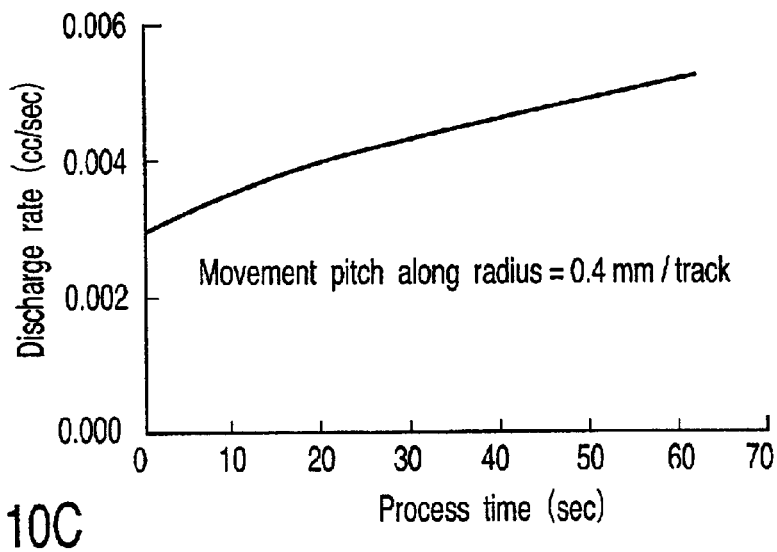
FIG. 10C is a characteristic chart showing a solution discharge rate with reference to a process time according to the third embodiment.

Relations in FIGS. 10A to 10C are used to control the solution supply nozzle, the in-process substrate rotational frequency, and the solution discharge speed. These relations are stored in the controller in advance. It may be preferable to store these relations in downstream control sections individually. Then the light absorptive/reactive material solution is applied to the in-process substrate. The description to follow uses a plus axis (+) to express the same movement as the nozzle movement direction when the solution is supplied. The reverse movement is expressed as a minus axis (−).

First, the solution supply nozzle 122 is moved to a position +18 mm from the center of the in-process substrate 100. The solution block function 126a is adjusted so that it reaches a region of +20 mm or less. When the nozzle 122 is positioned +20 mm or less, the solution block function 126a operates so that the solution dropped from the solution supply nozzle 122 does not reach the surface of the in-process substrate 100.

Then, the substrate support 120 is driven. The in-process substrate 100 starts rotating to keep the rotational frequency of 133.5 rpm. A droplet amount of the light absorptive/reactive material solution is adjusted so that the solution should be ejected from the solution supply nozzle 122 at the discharge rate of 0.003 cc/min. After the in-process substrate rotational frequency and the solution feed rate are stabilized, the solution supply nozzle 122 starts moving toward the plus side. When the center of the nozzle discharge opening is positioned +20 mm or less, uniform velocities are maintained for the substrate rotation, the nozzle movement, and the solution feed. The solution discharged in the meantime does not reach the substrate surface by inserting the solution block function 126a provided between the solution supply nozzle 122 and the in-process substrate 100.

When the center of the nozzle discharge opening reaches +20 mm, the rotation drive control section 128, the nozzle drive control section 127, and the solution supply pump 125 are controlled according to FIGS. 10A to 10C. When the solution supply nozzle 122 reaches above the solution block function 126b at the edge of the substrate 100, the solution supply pump 125 stops, the solution supply nozzle 122 stops, and the in-process substrate 100 stops rotating to complete the solution film formation.

It took about 62 seconds to coat a single CD-R with the solution. The solution film spirally formed during the process spreads and is combined to the adjacent solution film to form a solution film which covers the entire substrate except the edge. During the process, no solution was ejected outward from the substrate.

The in-process substrate is then placed in the chamber and is exposed under almost the same pressure as a steam pressure for the solvent in the solution. The solvent is gradually removed to form a light absorptive/reactive film.

This embodiment has explained a process of forming a light absorptive/reactive film on the CD-R. The present invention is not limited to this usage. The present invention is also applicable to coating on all types of disk-shaped substrates including a magnetic film for MiniDiscs (MD) and hard disks, a recording/reproducing layer for phase-change optical disks such as digital video disk RAM (DVD-RAM), a reflection film for original CD plates, and the like. The coating material is not limited to the light absorptive/reactive film. The coating is also applicable to solution containing a magnetic or metallic material. The nozzle movement speed, the substrate rotational frequency, and the solution discharge rate with reference to the process time are not limited to the relations shown in FIGS. 10A to 10C. Any value is specifiable as long as the equations (1) to (5) are satisfied. In the equations (1) to (5), the constant 100 can be expressed with a specific position along the diameter direction using the in-process substrate center as a reference point. The constant v0 can be expressed with a solution feed rate at a specific position along the diameter direction using the in-process substrate center as a reference point. The constant w0 can be expressed with an in-process substrate rotational frequency at a specific position along the diameter direction using the in-process substrate center as a reference point.

The rotational frequency w0 is not limited to 78 rpm at the outmost periphery (r=60 mm) of the substrate. Any value is specifiable as long as a small amount of solution does not overflow outside the substrate. In this embodiment, it may be preferable to use a value of 100 rpm or less. It may be also preferable to modify an interval of spiral solution film formation positions for each cycle and the solution feed rate v0 with r=60 mm depending on a desired film thickness and uniformity.

[Fourth Embodiment]

Figure 11:
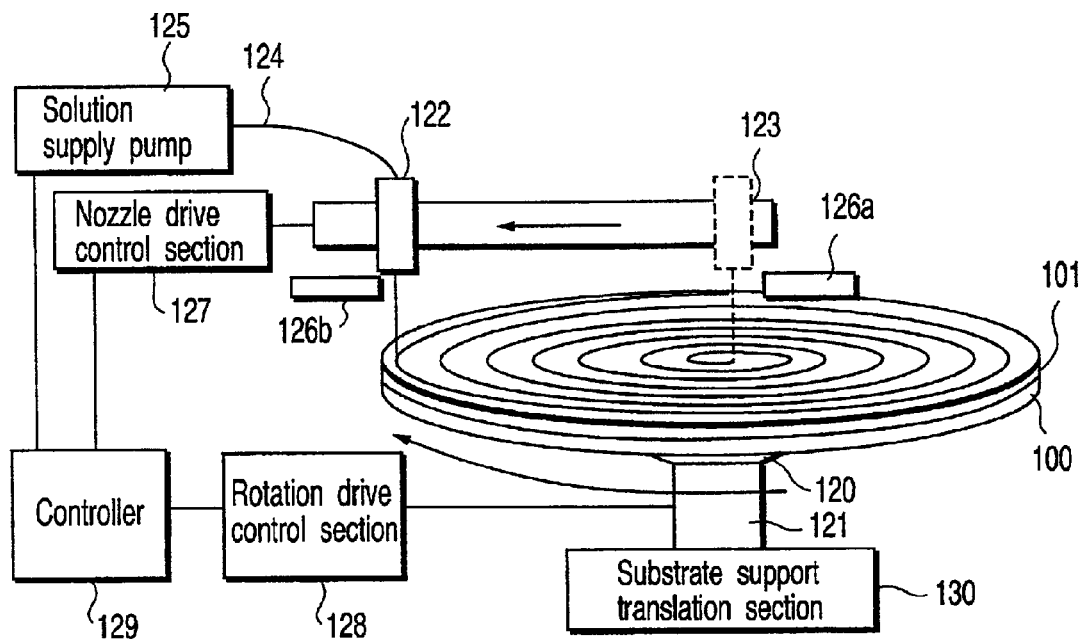
FIG. 11 is a configuration chart showing a configuration of a film formation apparatus according to a fourth embodiment.

FIG. 11 schematically shows a configuration of a film formation apparatus according to a fourth embodiment. The mutually corresponding parts in FIGS. 11 and 1 are designated by the same reference numerals. The description thereof is omitted.

The in-process substrate 100 is mounted on the substrate support 120. The substrate support 120 is provided with the drive system 121 rotating at the substrate center. These are further mounted on a substrate support translation section 130 which can move front/back viewed from FIG. 11.

Above the in-process substrate 100, there is provided, say, the solution supply nozzle 122 as shown in FIG. 2. A solution discharge from the solution supply nozzle is controlled by controlling the pressure of the solution supply pump located upstream of the nozzle. The solution supply nozzle is mounted on a nozzle transport function which can reciprocally move right/left viewed from FIG. 11. Between the solution supply nozzle and the in-process substrate there is provided a solution block function 126 which can move in the same direction as the movement of the solution supply nozzle.

For easy understanding of the explanation below, the X-axis is used for expressing a translational drive direction of the substrate support 120 including the diameter of the in-process substrate 100. The Y-axis is used for expressing a trail of the discharge opening when the solution supply nozzle 122 is driven. The solution supply nozzle 122 lies at right angles to the substrate support 120. An intersection point between the X-axis and the Y-axis is referred to as an apparatus reference point. The center of the circular in-process substrate is referred to as a substrate origin. The apparatus reference point is used as the origin (0,0) of X-Y coordinates. Positions are expressed in units of mm.

Figure 12:
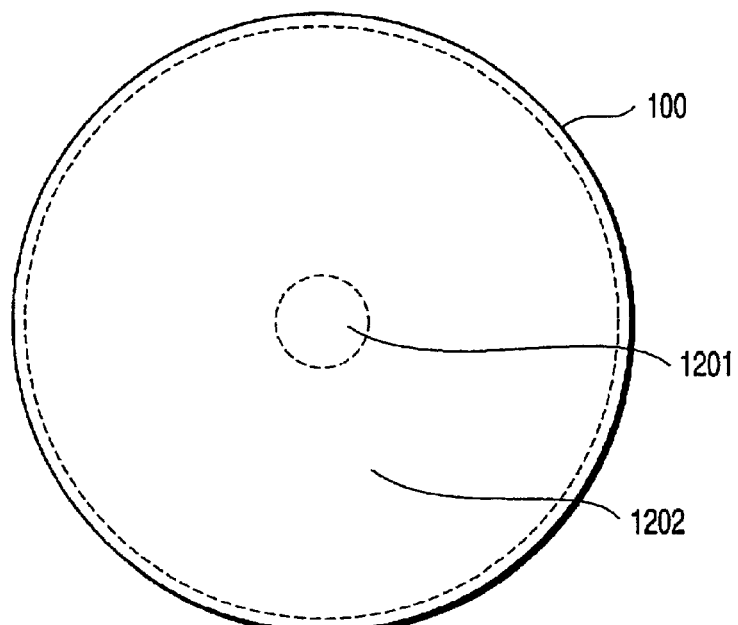
FIG. 12 shows a linear coating region and a spiral coating region on an in-process substrate according to the fourth embodiment.

This embodiment describes a technique of forming a solution film by using the fluidity of a supplied solution. As shown in FIG. 12, the nozzle transport function reciprocally operates the nozzle across a linear coating region 1201 within φ30 mm. At every turning point for the nozzle, a substrate support translation section 130 is operated to supply the solution onto the in-process substrate in parallel lines. The drive system 121 is operated across a spiral coating region 1202 outside φ30 mm to spirally supply the solution onto the in-process substrate 100.

A substrate-handling arm is used to transfer the in-process substrate 100 on the substrate support 120 and hold it. The in-process substrate 100 used here is an Si wafer in the middle of the semiconductor manufacturing process. Its substrate surface is flattened.

First, the translation drive system 130 for the substrate support 120 is operated to position the substrate origin to (15, 0) with reference to the apparatus reference point. Then, the solution block function 126 is placed between the solution supply nozzle 122 and the in-process substrate 100. With this state, the solution supply pump 125 is operated to start discharging the solution from the solution supply nozzle 122. Pressure of the solution supply pump 125 is controlled so that a discharge rate becomes 0.0026 cc/sec. When the solution discharge becomes stable, the solution supply nozzle 122 starts reciprocal movement along the Y-axis. At this time, the solution block function 126 placed between the solution supply nozzle 122 and the in-process substrate 100 is moved in accordance with movement of the solution supply nozzle 122 so that the solution is not supplied outside a region within φ29.5 mm from the substrate origin.

In this case, the solution supply nozzle 122 performs a uniform motion at 36.6 cm/sec within the φ29.5 mm region from the substrate origin. The nozzle is decelerated at 150 m/sec$^2$ outside the φ29.5 mm region and stops. Immediately thereafter, the nozzle is accelerated at 150 m/sec$^2$ in the reverse direction and is controlled to operate at 36.6 cm/sec until the nozzle reaches the φ29.5 mm region again. The substrate support translation section 130 is moved for (−0.4, 0) while the solution supply nozzle 122 is positioned outside the φ29.5 mm region.

Figure 15:
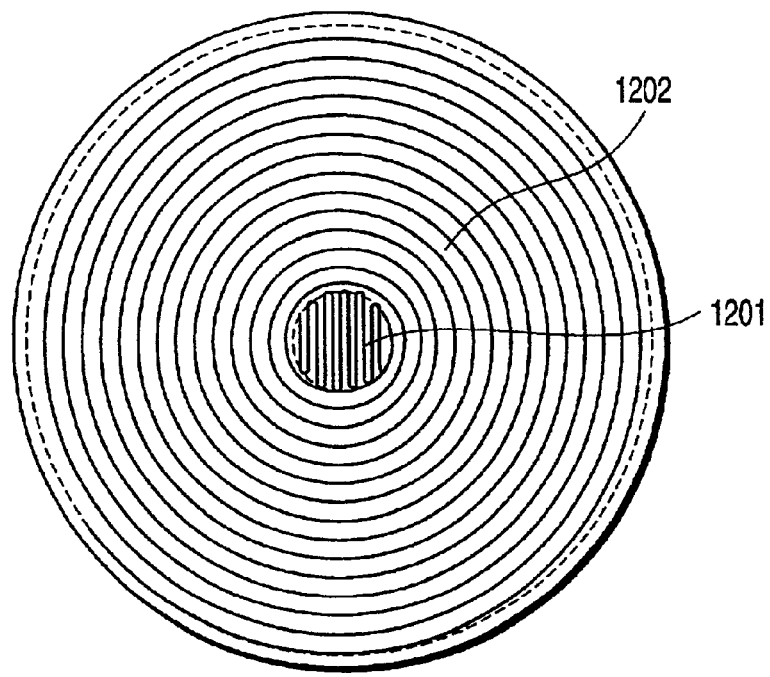
FIG. 15 shows a movement trail of the solution supply nozzle on the in-process substrate according to the fourth embodiment.
Figure 17A:
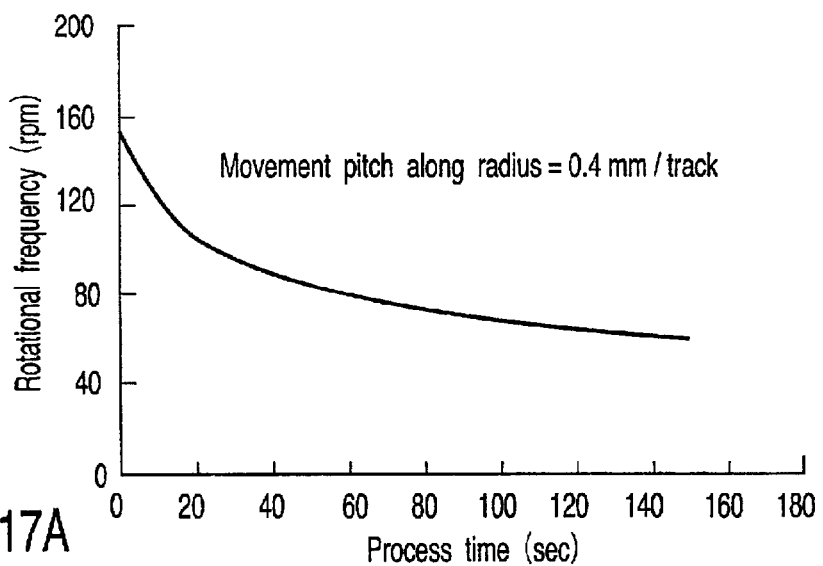
FIG. 17A is a characteristic chart showing a rotational frequency of an in-process substrate with reference to a process time according to the fourth embodiment.
Figure 17B:
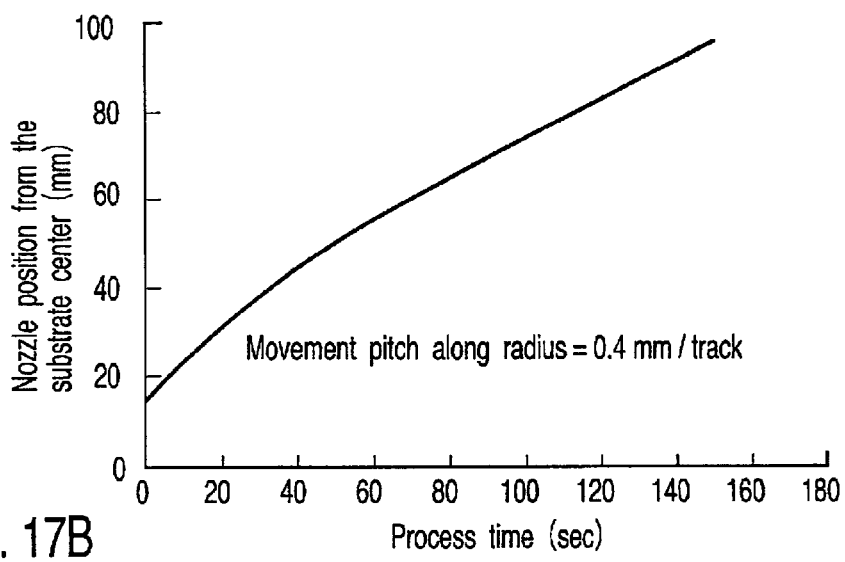
FIG. 17B is a characteristic chart showing a nozzle position with reference to a process time according to the fourth embodiment.
Figure 17C:
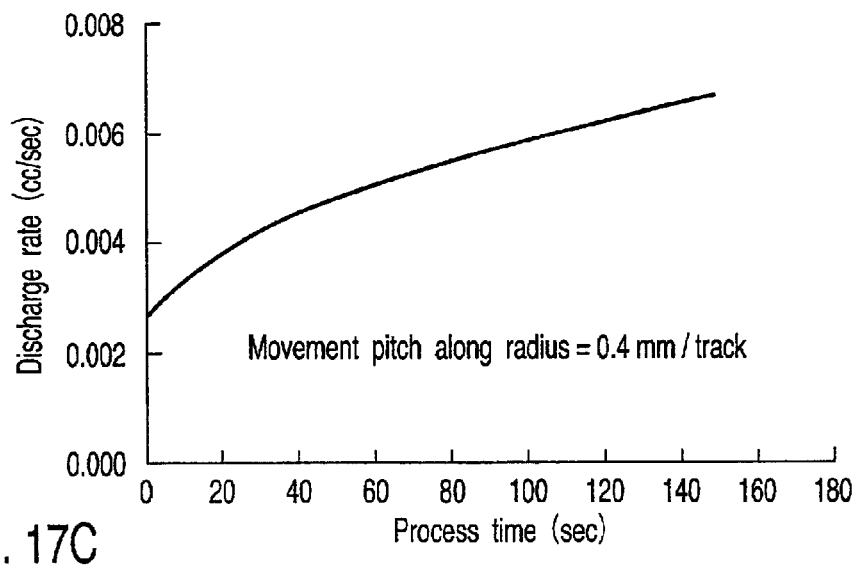
FIG. 17C is a characteristic chart showing a solution discharge rate with reference to a process time according to the fourth embodiment.

With the substrate origin positioned to (−15, 0), the in-process substrate starts rotation around the substrate origin by approximately maintaining the discharge rate (0.0026 cc/sec) in the linear coating region. When the rotational frequency reaches 160 rpm, the solution block function 126 is removed, initiating operations based on the relations in FIGS. 17A to 17C. Here, the process time is set to 0 when the spiral coating operation starts. A coating film has been formed in the spiral coating region 1202 according to a trail as shown in FIG. 14. For easy understanding of trails, pitches and lines in FIGS. 13 and 14 are expressed by enlarging those actually used for this embodiment. FIG. 15 shows a trail of the solution finally applied on the in-process substrate 100. The pitch and the line are expressed by enlarging those actually used for this embodiment.

The need to change discharge rates is eliminated by letting the discharge rate for the linear coating region almost equal the initial discharge rate for the spiral coating region. Changing a discharge rate wastes the solution discharged until the discharge rate becomes stable. Approximately equalizing the discharge rates with each other prevents the solution from being wasted.

These operations enabled to form a solution film all over the φ200 mm surface. The linearly supplied solution film connects with the adjacent solution film during the process due to the fluidity, forming the solution film covering the entire substrate surface except the edge. During the process, no solution was ejected outward from the substrate.

After the solution film is formed on the surface of the in-process substrate 100, this substrate is then placed in the chamber and is exposed under almost the same pressure as a steam pressure for the solvent in the solution. The solvent is gradually removed to form a photosensitive resin film.

The conventional solution film formation just moves the nozzle reciprocally and linearly by bridging the substrate, requiring an entrance region for every turn. This method ejects the solution outside the substrate at a disposal rate of 10% to 20% for the amount of solution supplied to the in-process substrate. The disposal rate is found by "the amount of solution ejected outside the substrate" divided by "the feed quantity within the substrate". The present invention keeps the solution on the substrate except when a small amount of solution is discarded just before and after the coating. It is possible to achieve a disposal amount within 1%. The present invention also improves a film thickness anomaly which slightly occurs at the center due to entirely spiral coating.

This embodiment has explained a process of forming a photosensitive resin film from the photosensitive resin solution and then the photosensitive resin solution film in order. The present invention is not limited to this usage. The present invention is also applicable to formation of a dielectric constant film from a solution containing a low-dielectric constant film material such as an organic siloxane solution, and formation of a ferroelectric film from a solution containing a ferroelectric film material.

The rotational frequency w0 is not limited to 60 rpm at the outmost periphery of the substrate. Any value is specifiable as long as a small amount of solution does not overflow outside the substrate. In this embodiment, it may be preferable to use a value of 80 rpm or less. It may be also preferable to modify an interval of spiral solution film formation positions for each cycle and the solution feed rate v0 (assumed value) with r=100 mm depending on a desired film thickness and uniformity.

Unless the solution comes out of the in-process substrate, it may be preferable to change the coating sequence as follows.

a) Spirally applying the solution from the outside to the inside and then applying the solution in parallel lines at the center.

b) Spirally applying the solution from the inside to the outside and then applying the solution in parallel lines at the center.

c) Applying the solution in parallel lines at the center and then spirally applying the solution from the outside to the inside.

Figure 16:
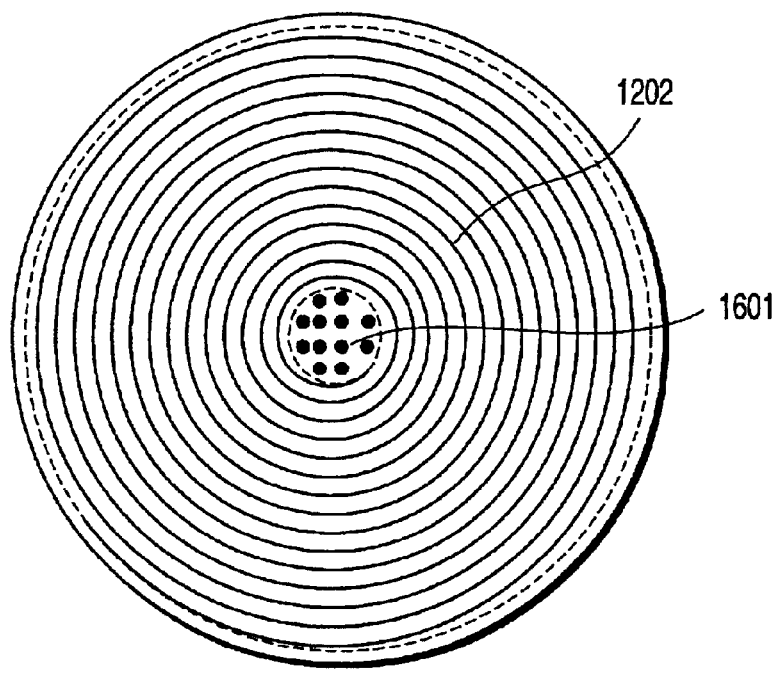
FIG. 16 shows a trail of solution dropped from the solution supply nozzle when dots of dropped solution are left in a region including the in-process substrate center for forming a solution film.

It may be preferable to supply the solution in dots instead of in parallel lines. The total volume of solution in dots formed within the φ29.5 mm region is the same as that supplied in parallel lines. If there is little variability in the thickness of the finally combined solution film, it may be preferable to properly set a droplet amount and dropping positions. FIG. 16 shows that the solution is supplied in dots within a dot coating region 1601 including the in-process substrate center. The dot and line pitches and the spacing are expressed by enlarging the actual sizes. The thus supplied dots of solution spread over the in-process substrate and overlap with each other to form an integral solution film.

At this time, instead of dropping the solution in dots by turning on or off a pump operation, it is desirable to continuously drop the solution and partially block droplets of the solution by means of the solution block function 126 for supplying the solution in dots. Controllability for the droplet amount is improved by blocking the solution for generating droplets rather than by turning on or off the pump operation.

In this embodiment, the boundary of the spiral coating region is set to φ29.5 mm, but is not limited thereto. It may be preferable to change this boundary according to capabilities of the solution supply pump, the rotation function, and the solution supply nozzle movement function. For decreasing the solution disposal amount, it is desirable to set the boundary near the substrate center as closely as possible.

[Fifth Embodiment]

This embodiment concerns how to modify parameters when the solution supply pump reaches the limits of its capability in the fourth embodiment. Here, a pump pressure is used as a control parameter for supplying the solution. The nozzle was set to move 0.8 mm per rotation. The lower limit for the pump pressure control was 1 kgf/cm$^2$. It was expected that the process time of 7.5 seconds or shorter would cause the pressure to be 1 kgf/cm$^2$ or less, making the pressure uncontrollable. For the process time of 7.5 seconds or shorter, the discharge pressure was stabilized at 1 kgf/cm$^2$. The rotational frequency was used for control so that the feed quantity per unit area becomes constant. Based on these conditions, there are determined substrate rotational frequencies, nozzle positions from the substrate center, and discharge rates with reference to process times as shown in FIGS. 18A to 18C.

First, the translation drive system for the substrate support member is operated to position the substrate origin to (15, 0) with reference to the apparatus reference point. Then, the solution block function 126 is arranged between the solution supply nozzle and the in-process substrate to start discharging the solution from the solution supply nozzle. The pump pressure is controlled so that the discharge pressure becomes 1 kgf/cm$^2$. When the solution discharge becomes stable, the solution supply nozzle starts reciprocal movement along the Y-axis. At this time, the solution block function placed between the solution supply nozzle and the in-process substrate is moved in accordance with movement of the solution supply nozzle so that the solution is not supplied outside a region within φ29.5 mm from the substrate origin. In this case, the solution supply nozzle performs a uniform motion at 19.7 cm/sec within the φ29.5 mm region from the substrate origin. The nozzle is decelerated at 150 m/sec$^2$ outside the φ29.5 mm region and stops. Immediately thereafter, the nozzle is accelerated at 150 m/sec$^2$ in the reverse direction and is controlled to operate at 19.7 cm/sec until the nozzle reaches the φ29.5 mm region again. The substrate support translation function is moved for (−0.4, 0) while the solution supply nozzle is positioned outside the φ29.5 mm region. As shown in FIG. 13, when the substrate origin reaches (−15, 0) after repetition of these operations, a linear coating film can be formed within the φ30 mm region enclosed in the broken line. At this time, the solution block function 126 is inserted between the solution supply nozzle and the in-process substrate for temporarily blocking a solution supply.

With the substrate origin positioned to (−15, 0), the in-process substrate starts rotation around the substrate origin. When the rotational frequency reaches 155 rpm, the solution block function 126 is removed, initiating operations based on the relations in FIGS. 18A to 18C. Here, the process time is set to 0 when the spiral coating operation starts. The solution supply nozzle maintains a uniform pressure for the first 7.5 seconds. During this period, the rotational frequency is changed greatly. 7.5 seconds later, a film formation is performed by controlling the solution supply nozzle pressure and the rotational frequency. These operations enabled to form a solution film all over the φ200 mm surface. The linearly supplied solution film connects with the adjacent solution film during the process due to the fluidity, forming the solution film covering the entire substrate surface except the edge. During the process, no solution was ejected outward from the substrate.

The substrate is then placed in the chamber and is exposed under almost the same pressure as a steam pressure for the solvent in the solution. The solvent is gradually removed to form a photosensitive resin film.

This embodiment concerns the recipe modification when the solution supply pump control reaches the limits and the rotational frequency control has an allowance. Also when the rotational frequency control reaches the limits and the solution supply pump control has an allowance, the amount of change in the discharge pressure should be specified on the basis of the equations (1) to (5) by keeping the rotational frequency constant in the limiting region. In consideration of the limits on the solution supply pump control and the rotational frequency control, it may be preferable to change the distribution of loads on the controls using any value "a" as in the following equations (6) and (7).

$$V = v0 \times a/(R/r)^{1/2} \tag{6}$$

$$W = W0/a \times (R/r)^{1/2} \tag{7}$$

$$P = \{P0 \times a/(R/r)^{1/2}\}^2$$

where v0 and W0 denote the solution feed rate and the rotational frequency for radius R mm, respectively. When the pressure is controlled, diameter "r" in the equation (6) could be defined as follows with respect to the solution discharge pressure P0 for the radius R mm of the solution supply pump.

The conventional solution film formation just moves the nozzle reciprocally and linearly by bridging the substrate, requiring an entrance region for every turn. This method ejects the solution outside the substrate at a disposal rate of 10% to 20% for the amount of solution supplied to the in-process substrate. The disposal rate is found by "the amount of solution ejected outside the substrate" divided by "the feed quantity within the substrate". The present invention keeps the solution on the substrate except when a small amount of solution is discarded just before and after the coating. It is possible to achieve a disposal amount within 1%. The present invention also improves a film thickness anomaly which slightly occurs at the center due to entirely spiral coating.

This embodiment has explained a process of forming a photosensitive resin film from the photosensitive resin solution and then the photosensitive resin solution film in order. The present invention is not limited to this usage. The present invention is also applicable to formation of a dielectric constant film from solution containing a low-dielectric constant film material such as an organic siloxane solution, and formation of a ferroelectric film from a solution containing a ferroelectric film material.

The rotational frequency w0 is not limited to 60 rpm at the outmost periphery of the substrate. Any value is specifiable as long as a small amount of solution does not overflow outside the substrate. In this embodiment, it may be preferable to use a value of 80 rpm or less. It may be also preferable to modify an interval of spiral solution film formation positions for each cycle and the solution feed rate v0 with r=100 mm depending on a desired film thickness and uniformity.

Unless the solution comes out of the in-process substrate, it may be preferable to change the coating sequence as follows.

a) Spirally applying the solution from the outside to the inside and then applying the solution in parallel lines at the center.

b) Spirally applying the solution from the inside to the outside and then applying the solution in parallel lines at the center.

c) Applying the solution in parallel lines at the center and then spirally applying the solution from the outside to the inside.

It may be preferable to supply the solution in dots instead of in parallel lines. The total volume of solution in dots formed within the φ29.5 mm region is the same as that supplied in parallel lines. If there is little variability in the thickness of the finally combined solution film, it may be preferable to properly set a droplet amount and dropping positions.

In this embodiment, the boundary of the spiral coating region is set to φ29.5 mm, but is not limited thereto. It may be preferable to change this boundary according to capabilities of the solution supply pump, the rotation function, and the solution supply nozzle movement function. For decreasing the solution disposal amount, it is desirable to set the boundary near the substrate center as closely as possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a solution film on an in-process substrate by using a dropping section for dropping liquid and the in-process substrate just under said dropping section, maintaining the liquid dropped from said dropping section on said in-process substrate, and relatively moving said in-process substrate or said dropping section, wherein relative movement between said in-process substrate and said dropping section comprises rotating said in-process substrate and relatively moving said dropping section from an inner periphery of said in-process substrate toward an outer periphery of said in-process substrate for spirally dropping said liquid on said in-process substrate so that the move pitch of the dropping unit in the radial direction occurring in every revolution of the in-process substrate is fixed;

a rotational frequency w for said substrate is decreased so that the liquid dropped from said dropping section on said in-process substrate stays at a dropped position in accordance with relative movement of said dropping section from the inner periphery of said in-process substrate toward the outer periphery; and a feed rate v for said liquid from said dropping section is increased in accordance with relative movement of said dropping section from the inner periphery of said in-process substrate towards the outer periphery.

2. The film formation method according to claim 1, wherein when said dropping section is positioned to distance r from a center of said in-process substrate, feed rate v for said liquid from said dropping section is determined in accordance with rotational frequency w for said in-process substrate so that a constant value is maintained for a product of rotational frequency w and feed rate v of said substrate support.

3. The film formation method according to claim 2, wherein rotational frequency w0 is assumed for an in-process substrate when said dropping section is positioned to radius R on said in-process substrate and feed rate v0 is assumed for said liquid when said dropping section is positioned to distance r from a center of said in-process substrate center; and when said substrate is positioned to said distance r, rotational frequency w for said substrate is determined by a product of the square root of (R/r) by w0 and feed rate v is determined by v0 divided by the square root of (R/r).

4. The film formation method according to claim 3, wherein when said in-process substrate is a disk-shaped substrate with radius R (mm), said dropping section drops liquid at the outmost periphery of said substrate and a rotational frequency (rpm) for said substrate is smaller than the square root of 1,000,000/R.

5. The film formation method according to claim 4, wherein when said in-process substrate is a disk-shaped substrate 200 mm in diameter, said dropping section drops liquid at the outmost periphery of said substrate and a rotational frequency for said substrate is 99 rpm or less.

6. The film formation method according to claim 4, wherein when said in-process substrate is a disk-shaped substrate 300 mm in diameter, said dropping section drops liquid at the outmost periphery of said substrate and a rotational frequency for said substrate is 81 rpm or less.

7. The film formation method according to claim 1, wherein said dropping section includes a plurality of discharge openings for discharging liquid; and a discharge rate of said dropping section and a rotational frequency of said in-process substrate are determined by an average of displacements for a plurality of discharge openings.

8. The film formation method according to claim 1, wherein relative movement of said dropping section from the inner periphery of said in-process substrate toward the outer periphery corresponds to the relative movement of said in-process substrate from an approximate center toward the outer periphery; and relative movement of said dropping section from the outer periphery of said in-process substrate toward the inner periphery corresponds to relative movement of said in-process substrate from the outer periphery toward an approximate center.

9. The film formation method according to claim 1, wherein a region including an approximate center of said in-process substrate is used in such a manner that said dropping section moves in a column direction from one end to the other in said region including an approximate center and moves in a row direction outside said region including an approximate center based on the relative movement between said in-process substrate and said dropping section, and said dropping section supplies said in-process substrate with solution at feed rate v to form a solution film.

10. The film formation method according to claim 9, wherein said feed rate v is set so that it almost equals feed rate v for liquid spirally dropped just outside said region including an approximate center.

11. The film formation method according to claim 1, wherein a region including an approximate center on said in-process substrate prevents a solution film from moving due to a centrifugal force applied to a dropped solution film by partially blocking liquid discharged from said dropping section so as not to reach said in-process substrate for droplet amount adjustment.

12. The film formation method according to claim 1, wherein said liquid is one selected from the group consisting of a solution containing antireflection used for an exposure process, a solution containing photosensitive material, a solution containing low-dielectric material, a solution containing ferroelectric material, a solution containing electrode material a solution containing pattern transfer material, a solution containing magnetic material used for a disk-shaped storage medium, and a solution containing a light absorptive/reactive material used for a disk-shaped storage medium.

13. The film formation method according to claim 1, wherein said in-process substrate with said solution film formed thereon is exposed under a pressure lower than a steam pressure at a process temperature for a solvent in said solution film, and said solvent is dried and removed to form a solid layer.

14. The film formation method according to claim 13, wherein said formed solution film is dried with vibration applied to form a solid layer having an almost flat surface.

15. A method of manufacturing a semiconductor element for forming said solid layer on said in-process substrate by using the film formation method described in claim 13, wherein said in-process substrate is a semiconductor substrate and said solid layer is selected from at least one of an anti-reflection photosensitive film used for an exposure process, a low-dielectric film, an inter-layer insulator, a ferroelectric film, an electrode, and a pattern transfer film.

16. The method of manufacturing a disk-shaped storage medium forming said solid layer on said in-process substrate by using the film formation method described in claim 13, wherein said solid layer is a magnetic film or a light absorptive/reactive film.

17. The film formation method according to claim 1, wherein said in-process substrate with said solution film formed thereon is exposed to a current of air to dry and remove solvent in said solution film for forming a solid layer.

18. The film formation method according to claim 17, wherein said formed solution film is dried with vibration applied to form a solid layer having an almost flat surface.

19. The method of manufacturing a semiconductor element forming said solid layer on said in-process substrate by using the film formation method described in claim 17, wherein said in-process substrate is a semiconductor substrate and said solid layer is selected from at least one of an anti-reflection photosensitive film used for an exposure process, a low-dielectric film, an inter-layer insulator, a ferroelectric film, an electrode, and a pattern transfer film.

20. The method of manufacturing a disk-shaped storage medium forming said solid layer on said in-process substrate by using the film formation method described in claim 17, wherein said solid layer is a magnetic film or a light absorptive/reactive film.

* * * * *

UNITED STATES PATENT AND TRADEMARK OFFICE
CERTIFICATE OF CORRECTION

PATENT NO. : 6,960,540 B2
DATED : November 1, 2005
INVENTOR(S) : Ito et al.

It is certified that error appears in the above-identified patent and that said Letters Patent is hereby corrected as shown below:

Column 19,
Line 49, change "relative" to -- a relative --.

Column 20,
Line 63, change "rate v to" to -- rate v' to --.
Line 65, change "rate v is" to -- rate v' is --.

Signed and Sealed this

Second Day of May, 2006

JON W. DUDAS
*Director of the United States Patent and Trademark Office*